United States Patent
Matsumoto et al.

(10) Patent No.: US 6,831,513 B2
(45) Date of Patent: Dec. 14, 2004

(54) DIFFERENTIAL AMPLIFIER

(75) Inventors: Shuichi Matsumoto, Chiba (JP); Akira Yoshida, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/341,404

(22) Filed: Jan. 14, 2003

(65) Prior Publication Data

US 2003/0132803 A1 Jul. 17, 2003

Related U.S. Application Data

(60) Provisional application No. 60/348,376, filed on Jan. 16, 2002.

(51) Int. Cl.[7] ................................................ H03F 3/45
(52) U.S. Cl. ....................... 330/253; 330/257; 330/261
(58) Field of Search ................................ 330/253, 257, 330/261

(56) References Cited

U.S. PATENT DOCUMENTS

| | | | | |
|---|---|---|---|---|
| 5,168,243 A | * | 12/1992 | Feliz et al. | 330/257 |
| 5,869,999 A | * | 2/1999 | Mawet | 330/253 |
| 6,483,382 B1 | * | 11/2002 | Gerstenhaber et al. | 330/252 |

FOREIGN PATENT DOCUMENTS

JP    6216665    * 8/1994

OTHER PUBLICATIONS

Bruun et al. "Dynamic range of Low–Voltage Cascode Current Mirrors" 1995 IEEE International Symposium on Circuits & Systems, vol. 2, Apr. 28 to May 3, 1995 pp 1328–1331.*

* cited by examiner

*Primary Examiner*—Michael B Shingleton
(74) *Attorney, Agent, or Firm*—Volentine Francos & Whitt, PLLC

(57) ABSTRACT

A differential amplifier includes a first diode having a first terminal and a second terminal wherein the first terminal is coupled to a voltage node and the second terminal is coupled to a first node, a second diode having a first terminal and a second terminal wherein the first terminal of the second diode is coupled to the voltage node and the second terminal of the second diode is coupled to a second node, a first transistor coupled to the first node in series with the first diode and having a control terminal coupled to a first input terminal, a second transistor coupled to the second node in series with the second diode and having a control terminal coupled to a second input terminal, and a bias current supply coupled to the first and second nodes to bias the first and second diodes.

15 Claims, 8 Drawing Sheets ial amplifier. Referring to FIG. 9, the conventional dif-
DIFFERENTIAL AMPLIFIER This application claims the benefit of U.S. Provisional Application No. 60/348,376 filed Jan. 16, 2002.

BACKGROUND OF THE INVENTION

1. Field of the Invention

The present invention relates, in general, to a semiconductor device and, more particularly, to a differential amplifier. This claims priority under 35 USC §119(e) (1) of Provisional Application No. 60/348,376, filed on Jan. 16, 2002.

2. Description of the Related Art

FIG. 9 is a block diagram showing a conventional differential amplifier. Referring to FIG. 9, the conventional differential amplifier comprises N-type MOSFET (NMOS transistor) 900-903 and a constant current source 904. Each NMOS transistor has a gate electrode, a source electrode and a drain electrode A supply voltage VDD is applied to the gate and drain electrodes of NMOS transistor 902. Also, the supply voltage VDD is applied to the gate and drain electrodes of NMOS transistor 903. FIG. 10 shows voltage-current characteristic of the NMOS transistors 902 and 903. The curved line shows the drain current of each NMOS transistors 902 and 903 relative to the gate-to-source voltage VGS. In a region A of the diagram, the NMOS transistors 902 and 903 are considered to be in an off-state, and in a region B of the diagram, the NMOS transistors 902 and 903 are considered to be in an on-state.

The operation of the conventional differential amplifier will be described with reference to FIGS. 9-11. FIG. 11 is a timing chart for explaining of the operation of the conventional differential amplifier when input with pulse signals, for example, clock signals. When a pulse signal IN1 having a rising edge is input to the gate electrode of the NMOS transistor 900, the NMOS transistor 900 rapidly changes its state from an off-state to an on-state. In this case, the voltage VGSb which is larger than the threshold voltage Vt is applied to between the gate and the source electrodes of NMOS transistor 902. The NMOS transistor 902 is considered to be in the region B. A parasitic capacitance which is provided between the drain and the source electrodes of the NMOS transistor 902 is charged. Therefore, the voltage level of an output signal OUT1 changes from a high voltage level to a low voltage level almost immediately.

On the other hand, when the pulse signal having a falling edge is input to the NMOS transistor 900, the NMOS transistor 900 changes its state from an on-state to an off-state, thus causing the source electrode of the NMOS transistor 902 to quickly become an open state. The parasitic capacitance of the NMOS transistor 902 is discharged, thus causing the voltage level of the output signal OUT1 to rise. A speed changing the voltage level from a low level to a high level depends on a discharge speed of the parasitic capacitance. Therefore, it takes a relative long period of time ΔT to change the voltage level of the output signal OUT1 from low voltage level to high voltage level. As seen in FIG. 11, the voltage level of the output signal OUT1 rises slowly. The same is true for the output signal OUT2.

Therefore, in the conventional difference amplifier, it takes a relatively long period of time ΔT to change the voltage level of the output signal from a low voltage level to a high voltage level, and distortions of the output signal thus become large.

SUMMARY OF THE INVENTION

According to one aspect of the present invention, there is provided a differential amplifier includes a first diode which has a first terminal and a second terminal wherein the first terminal of the first diode is coupled to a voltage node and wherein the second terminal of the first diode is coupled to a first node, a second diode which has a first terminal and a second terminal wherein the first terminal of the second diode is coupled to the voltage node and wherein the second terminal of the second diode is coupled to a second node, a first transistor which is coupled to the first node in series with the first diode and which has a control terminal coupled to a first input terminal, a second transistor which is coupled to the second node in series with the second diode and which has a control terminal coupled to a second input terminal, and a bias current supply which is coupled to the first and second nodes to bias the first and second diodes.

DETAILED DESCRIPTION OF THE PREFERRED EMBODIMENTS

A differential amplifier according to the preferred embodiments of the present invention will be described. Moreover, not all the combinations of the characteristics of the present invention described in the embodiments are essential to the present invention.

A differential amplifier according to a first preferred embodiment of the present invention will be described with reference to FIG. 1.

First, the composition of the differential amplifier according to the first preferred embodiment of the present invention will be described. FIG. 1 is a block diagram showing the amplifier circuit according to the first preferred embodiment of the present invention.

Figure 1:
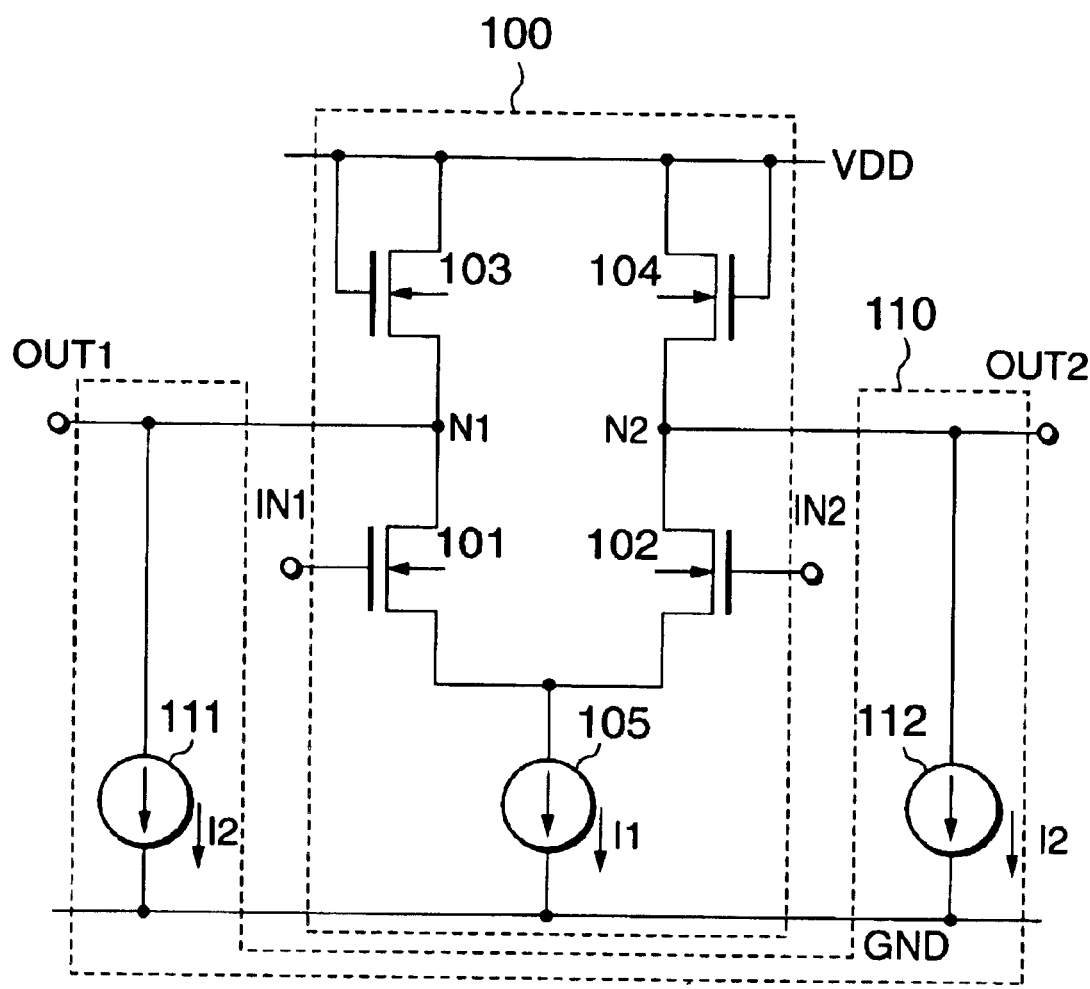
FIG. 1 is a block diagram showing a differential amplifier according to a first preferred embodiment of the present invention.

As shown in FIG. 1, the differential amplifier comprises a differential amplifier part 100 and a bias current supply 110. The differential amplifier part 100 comprises transistors 101 and 102, diodes 103 and 104 and a constant current source 105. Each of the transistors 101 and 102 comprises N-type MOSFET (NMOS transistor). Each of the diodes 103 and 104 comprises NMOS transistor. Each NMOS transistor has a gate electrode, a source electrode and a drain electrode. The diode 103 has a first terminal and a second terminal, wherein the first terminal of the diode 103 is coupled to a voltage node VDD, and wherein the second terminal of the diode 103 is coupled to a node N1. The diode 104 has a first terminal and a second terminal, wherein the first terminal of the diode 104 is coupled to the voltage node VDD, and wherein the second terminal of the diode 104 is coupled to a node N2. The transistor 101 is coupled to the node N1 in series with the diode 103, and has a control terminal coupled to an input terminal IN1. The transistor 102 is coupled to the node N2 in series with the diode 104, and has a control terminal coupled to an input terminal IN2. The bias current supply 110 is coupled to the nodes N1 and N2 to bias the diodes 103 and 104. The bias current supply 110 comprises constant current sources 111 and 112.

The gate electrode of the NMOS transistor 101 is connected with the input terminal IN1, the drain electrode is connected with the node N1 and the source electrode is connected with one terminal of the constant current source 105. The gate electrode of the NMOS transistor 102 is connected with the input terminal IN2, the drain electrode is connected with the node N2 and the source electrode is the terminal of the constant current source 105. A ground voltage GND is applied to the other terminal of the constant current source 105. A supply voltage VDD is applied to the gate and drain electrodes of the NMOS transistor 103. Also, the supply voltage VDD is applied to the gate and drain electrodes of the NMOS transistor 104. Each of the NMOS transistors 103 and 104 is provided as a diode (load diode). The source electrode of the NMOS transistor 103 is connected with the node N1, and the source electrode of the NMOS transistor 104 is connected with the node N2. One terminal of the constant current source 111 is connected with the node N1, and the ground voltage GND is applied to the other terminal of the constant current source 111. One terminal of the constant current source 112 is connected with the node N2, and the ground voltage GND is applied to the other terminal of the constant current source 112. That is, the constant current source 105 is provided for supplying a current to the NMOS transistors 101 and 102. Also, the constant current source 111 is provided for supplying a bias current to the NMOS transistor 103, and the constant current source 112 is provided for supplying a bias current to the NMOS transistor 104. The node N1 is connected with the output terminal OUT1. The node N2 is connected with the output terminal OUT2.

Figure 2:
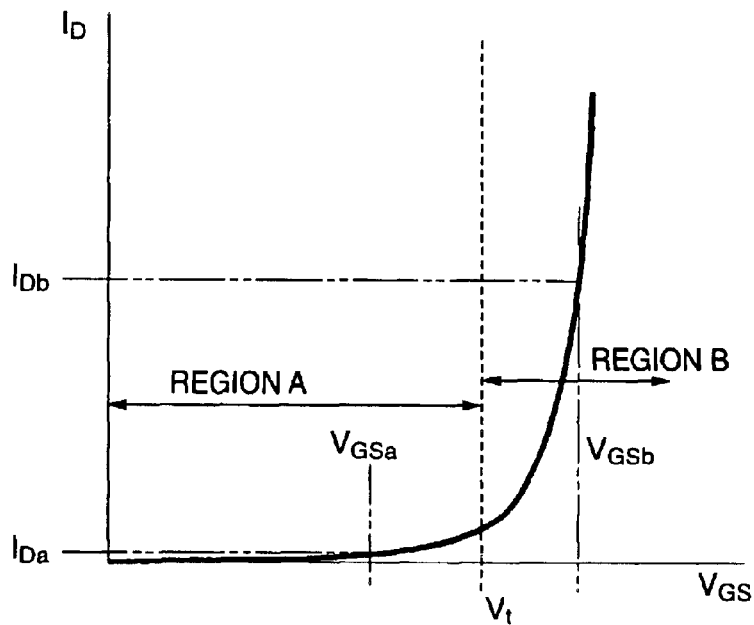
FIG. 2 is a voltage-current characteristic of the NMOS transistors of the differential amplifier according to the first preferred embodiment of the present invention.
Figure 3:
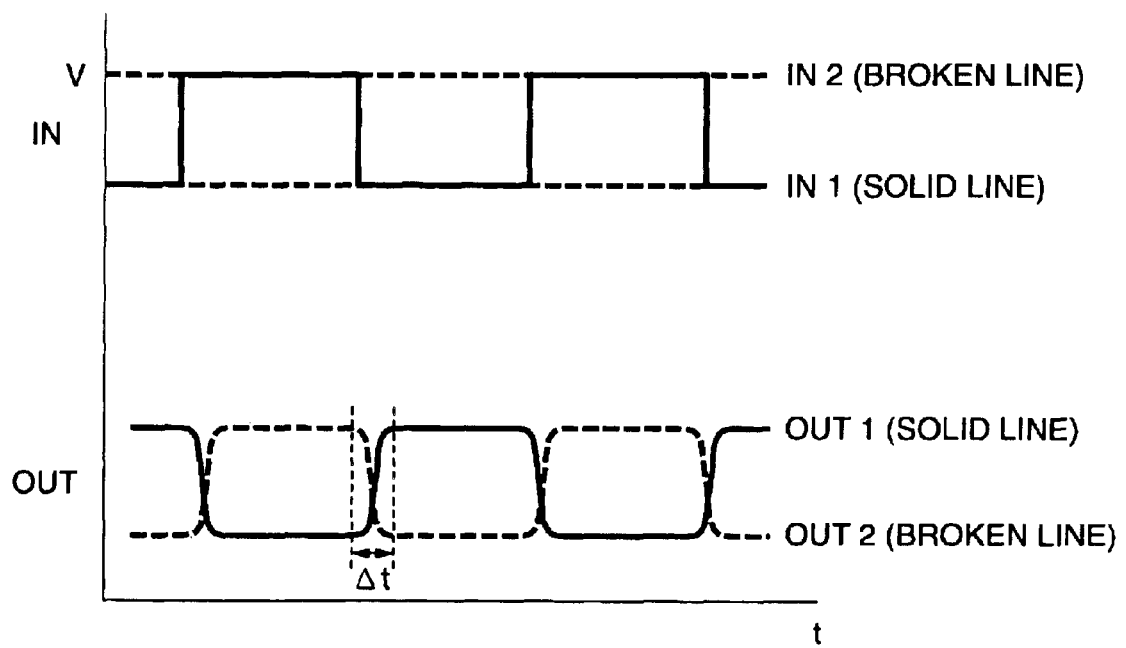
FIG. 3 is a timing chart for explaining of the operation of the differential amplifier according to the first preferred embodiment of the present invention.

Next, the operation of the differential amplifier according to the first preferred embodiment of the present invention will be described with reference to FIGS. 1-3. FIG. 2 shows voltage-current characteristic of the NMOS transistors 103 and 104. FIG. 3 is a timing chart for explaining the operation of the differential amplifier according to the first preferred embodiment of the present invention when input with pulse signals, for example, clock signals. As seen in FIG. 2, the curved line shows the drain current of each NMOS transistors 103 and 104 relative to the gate-to-source voltage VGS. In a region A of the diagram, the NMOS transistors 103 and 104 are considered to be in an off-state, and in a region B of the diagram, the NMOS transistors 103 and 104 are considered to be in an on-state. The bias current I2 is supplied to the NMOS transistor 103 to keep the state of the NMOS transistor 103 in a region B of the diagram, whether the NMOS transistor 101 is in an on-state or an off-state. Also, the bias current I2 is supplied to the NMOS transistor 104 to keep the state of the NMOS transistor 104 in a region B of the diagram, whether the NMOS transistor 102 is in an on-state or an off-state. Each of the gate-to-source voltage VGS of the NMOS transistors 103 and 104 is always larger than the threshold voltage Vt.

When a pulse signal IN1 having a rising edge is input to the gate electrode of the NMOS transistor 101, the NMOS transistor 101 rapidly changes its state from an off-state to an on-state. The gate-to-source voltage VGS of the NMOS transistor 103 rapidly increases to become much larger than the threshold value Vt (a region B of the diagram). Therefore, an output signal OUT1 having a low voltage level is output rapidly. In this case, a pulse signal IN2 having a falling edge is input to the gate electrode of the NMOS transistor 102, thus causing the output signal OUT2 having a high voltage level to be output.

When a pulse signal IN1 having a falling edge is input to the gate electrode of the NMOS transistor 101, the NMOS transistor 101 rapidly changes its state from an on-state to an off-state, thus causing the source electrode of the NMOS transistor 103 to be quickly an open state. The parasitic capacitance which is provided between the drain and the source electrodes of the NMOS transistor 103 is discharged within a region B of the diagram. The gate-to-source voltage VGS of the NMOS transistor 103 rapidly decreases to approach the threshold value Vt (a region B of the diagram). However, in this case, a bias current I2 is supplied to the NMOS transistor 103 to keep the state of the NMOS transistor 103 in a region B of the diagram. That is, the gate-to-source voltage VGS of the NMOS transistor 103 never becomes lower than the threshold voltage Vt. Therefore, an output signal OUT1 having a high voltage level is output within a short time At. In this case, a pulse signal IN2 having a rising edge is input to the gate electrode of the NMOS transistor 102, thus causing the output signal OUT2 having a low voltage level to be output.

In the differential amplifier according to the first preferred embodiment of the present invention, the NMOS transistors 103 and 104 which work as the diodes are supplied with the bias current so as not to cause the gate-to-source voltage VGS of the NMOS transistors 103 and 104 to be lower a than the threshold voltage Vt. The differential amplifier according to the first preferred embodiment reduces the time required for completely finishing the discharge of the parasitic capacitance. Therefore, the differential amplifier according to the first preferred embodiment of the present invention provides an output signal that changes from a low voltage level to a high voltage level, and conversely from a high voltage level to a low voltage level, over a short time period At, and thus reducing distortions of the output signal.

The differential amplifier according to the first preferred embodiment of the present invention is useful for a semiconductor circuit in a device, for example, a wireless device, which uses a pulse signal having a short cycle, for example, a radio frequency wave signal.

A differential amplifier according to a second preferred embodiment of the present invention will be described with reference to FIG. 4.

First, the composition of the differential amplifier according to the second preferred embodiment of the present invention will be described. FIG. 4 is a block diagram showing the amplifier circuit according to the second preferred embodiment of the present invention.

Figure 4:
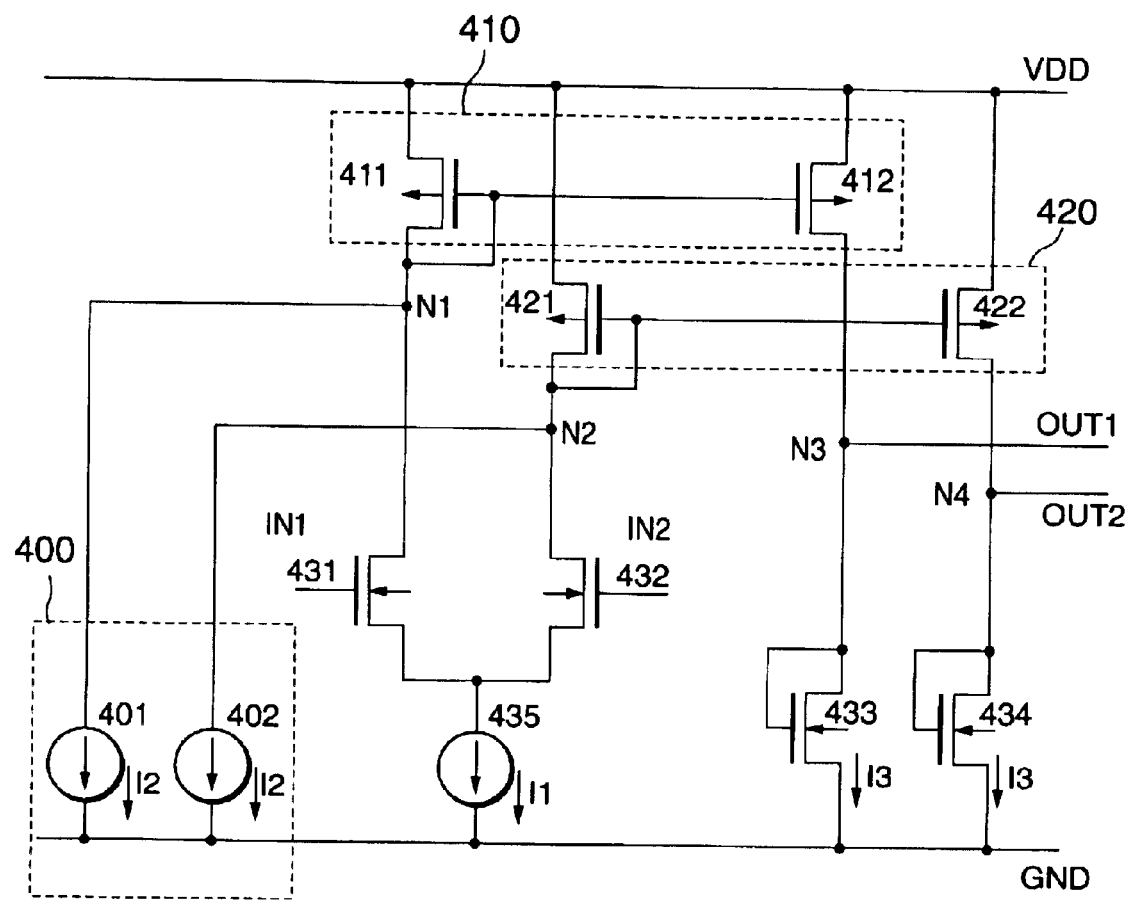
FIG. 4 is a block diagram showing a differential amplifier according to a second preferred embodiment of the present invention.

As shown in FIG. 4, the differential amplifier comprises current mirror circuits 410 and 420, transistors 431 and 432, diodes 433 and 434, a bias current supply 400 and a constant current source 435. The current mirror circuit 410 has a first current path which is connected with a node N1, and a second current path which is connected with a node N3. The current mirror circuit 420 has a first current path which is connected with a node N2, and a second current path which is connected with a node N4. A transistor 431 is coupled to the first current path of the current mirror circuit 410 through the node N1, and has a control terminal coupled to an input terminal IN1. A transistor 432 is coupled to the first current path of the current mirror circuit 420 through the node N2, and has a control terminal coupled to an input terminal IN2. A diode 433 has a first terminal and a second terminal, wherein the first terminal of the diode 433 is coupled to the second current path of the current mirror circuit 410 through a node N3, and wherein the second terminal of the diode 433 is coupled to a voltage node GND. A diode 434 has a first terminal and a second terminal, wherein the first terminal of the diode 434 is coupled to the second current path of the current mirror circuit 420 through a node N4, and wherein the second terminal of the diode 434 is coupled to the voltage node GND. A bias current supply 400 is coupled to the nodes N1 and N2 to bias the diodes 433 and 434. The current mirror circuit 410 comprises P-type MOSFET (PMOS transistor) 411 and 412. The current mirror circuit 420 comprises PMOS transistors 421 and 422. Each of the transistors 431 and 432 comprises N-type MOSFET (NMOS transistor). Each of the diodes 433 and 434 comprises NMOS transistor. Each NMOS transistor has a gate electrode, a source electrode and a drain electrode. Each PMOS transistor has a gate electrode, a source electrode and a drain electrode. The bias current supply 400 comprises constant current sources 401 and 402.

The gate electrode of the NMOS transistor 431 is connected with the input terminal IN1, the drain electrode is connected with the drain electrode of the PMOS transistor 411 through the node N1, and the source electrode is connected with one terminal of the constant current source 435. The gate electrode of the NMOS transistor 432 is connected with the input terminal IN2, the drain electrode is connected with the drain electrode of the PMOS transistor 421 through the node N2, and the source electrode is connected with the terminal of the constant current source 435. A ground voltage GND is applied to the other terminal of the constant current source 435. The constant current source 435 is provided for supplying a current to the NMOS transistors 431 and 432. A supply voltage VDD is applied to the source electrode of the PMOS transistor 411. The gate electrode of the PMOS transistor 411 is connected with the drain electrode thereof. The drain electrode of the PMOS transistor 411 is also connected with one terminal of the constant current source 401 through the node N1. A ground voltage GND is applied to the other terminal of the constant current source 401. The constant current source 401 is provided for supplying a bias current to the PMOS transistor 411 and the NMOS transistor 433. A supply voltage VDD is applied to the source electrode of the PMOS transistor 421. The gate electrode of the PMOS transistor 421 is connected with the drain electrode thereof. The drain electrode of the PMOS transistor 421 is also connected with one terminal of the constant current source 402 through the node N2. A ground voltage GND is applied to the other terminal of the constant current source 402. The constant current source 402 is provided for supplying a bias current to the PMOS transistor 421 and the NMOS transistor 434. The gate and drain electrodes of the NMOS transistor 433 are connected with the output terminal OUT1 through the node N3. A ground voltage GND is applied to the source electrode of the NMOS transistor 433. The NMOS transistor 433 is provided as a load diode. The gate and drain electrodes of the NMOS transistor 434 are connected with the output terminal OUT2 through the node N4. A ground voltage GND is applied to the source electrode of the NMOS transistor 434. The NMOS transistor 434 is also provided as the load diode. The gate electrode of the PMOS transistor 412 is connected with the gate electrode of the PMOS transistor 411, thus causing a current mirror circuit to comprise. The drain electrode of the PMOS transistor 412 is connected with the output terminal OUT1 through the node N3. A supply voltage VDD is applied to the source electrode of the PMOS transistor 412. The gate electrode of the PMOS transistor 422 is connected with the gate electrode of the PMOS transistor 421, thus causing a current mirror circuit to comprise. The drain electrode of the PMOS transistor 422 is connected with the output terminal OUT2 through the node N4. A supply voltage VDD is applied to the source electrode of the PMOS transistor 422.

Figure 5:
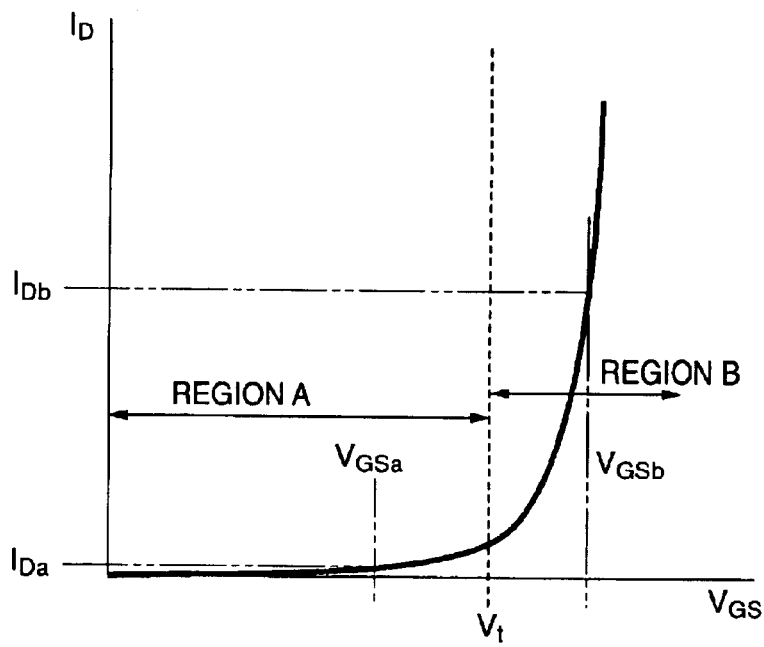
FIG. 5 is a voltage-current characteristic of the NMOS transistors of the differential amplifier according to the second preferred embodiment of the present invention.
Figure 6:
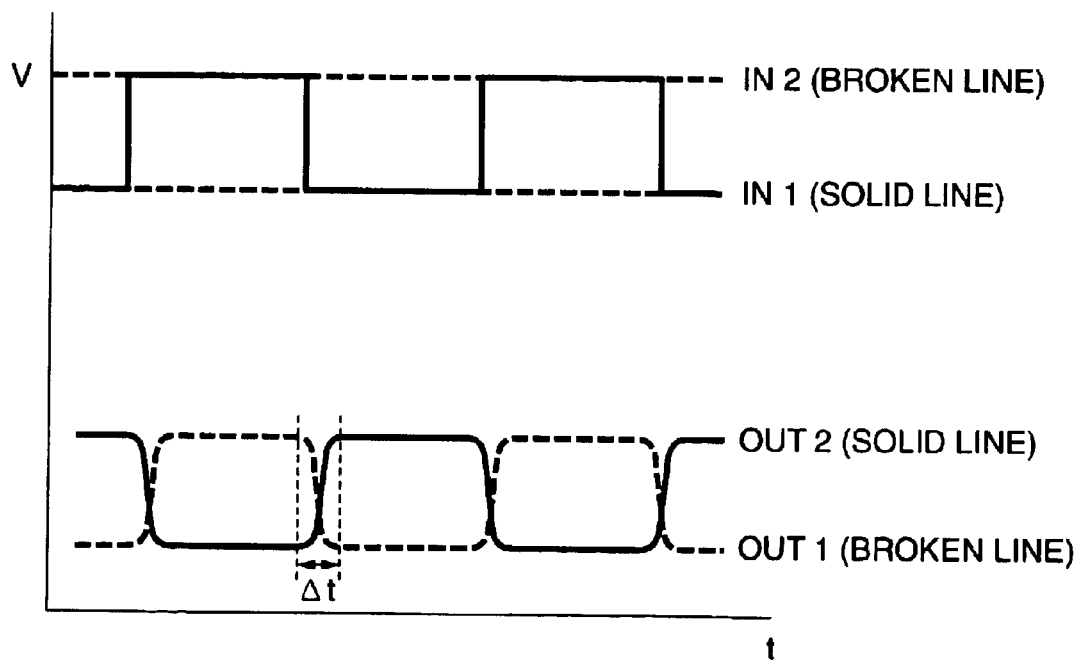
FIG. 6 is a timing chart for explaining of the operation of the differential amplifier according to the second preferred embodiment of the present invention.

Next, the operation of the differential amplifier according to the second preferred embodiment of the present invention will be described with reference to FIGS. 4-6. FIG. 5 shows voltage-current characteristic of the PMOS transistors 411 and 421. FIG. 6 is a timing chart for explaining the operation of the differential amplifier according to the second preferred embodiment of the present invention when input with pulse signals, for example, clock signals. As seen in FIG. 5, the curved line shows the drain current of each PMOS transistors 411 and 421 relative to the gate-to-source voltage VGS. In a region A of the diagram, the PMOS transistors 411 and 421 are considered to be in an off-state, and in a region B of the diagram, the PMOS transistors 411 and 421 are considered to be in an on-state. The bias current I2 is supplied to the PMOS transistor 411 to keep the state of the PMOS transistor 411 in a region B of the diagram, whether the NMOS transistor 431 is in an on-state or an off-state. Also, the bias current I2 is supplied to the PMOS transistor 421 to keep the state of the PMOS transistor 421 in a region B of the diagram, whether the NMOS transistor 432 is in an on-state or an off-state. Each of the gate-to-source voltage VGS of the PMOS transistors 411 and 421 is always larger than the threshold voltage Vt. The drain current of the PMOS transistors 411 and 421 is larger than the threshold voltage Vt, thus causing PMOS transistors 411 and 421 to be in a region B. The transistor size ratio of the PMOS transistors 411 and 412 is the proportion of one to two. Also, the transistor size ratio of the PMOS transistors 421 and 422 is the proportion of one to two.

When a pulse signal IN1 having a rising edge is input to the gate electrode of the NMOS transistor 431, the NMOS transistor 431 rapidly changes its state from an off-state to an on-state. The drain current is supplied to the PMOS transistors 411 and 412. The PMOS transistor 412 amplifies the drain current of the PMOS transistor 411 up to two times. The PMOS transistor 433 is supplied with the amplified drain current. Therefore, the output signal OUT1 having a high voltage level is output immediately. In this case, a pulse signal IN2 having a falling edge is input to the gate electrode of the. NMOS transistor 432, thus causing the output signal OUT2 having a low voltage level to be output.

When a pulse signal IN1 having a falling edge is input to the gate electrode of the NMOS transistor 431, the NMOS transistor 431 rapidly changes its state from an on-state to an off-state. The drain current of the NMOS transistor 431 is reduced, and the drain current of the PMOS transistor 411 also is reduced. Therefore, the gate-to-source voltage VGS of the PMOS transistors 411 and 412 rapidly decreases to approach the threshold value Vt (a region B of the diagram). However, in this case, a bias current I2 is supplied to the PMOS transistors 411 and 412 to keep the state of the PMOS transistors 411 and 412 in a region B of the diagram. That is, the gate-to-source voltage VGS of the PMOS transistors 411 and 412 never becomes lower than the threshold voltage Vt. The voltage level of the output signal OUT1 falls according to the change of the gate-to-source voltage VGS of the PMOS transistor 411. Thus when the gate-to-source voltage VGS of the PMOS transistor 411 becomes the threshold voltage Vt, the output signal OUT1 has a low voltage level. In this case, a pulse signal IN2 having a rising edge is input to the gate electrode of the NMOS transistor 432, thus causing the output signal OUT2 having a high voltage level to be output.

By the way, the PMOS transistors 411, 412, 421 and 422 and the NMOS transistors 433 and 434 also operate as a level-shift circuit in view of direct current. Based on the adjustment of bias current I2, the differential amplifier causes the direct current level of the output signal to change according to the direct current level of the input signal. The NMOS transistors 433 and 434 are kept in a region B of the diagram corresponding to bias current supplied by constant current sources 401 and 402. When the constant current source 401 increases the amount of bias current I2, the amount of the drain current of the PMOS transistor 411 is also increased. Therefore, the amounts of the drain current of the PMOS transistor 412 and the NMOS transistor 433 are increased. In other words, the direct current biases of the PMOS transistor 412 and the NMOS transistor 433 are increased. Therefore, the differential amplifier increases the direct current level of the output signal OUT1 according to increasing the amount of the bias current I2. The same is true for the constant current source 402. The differential amplifier increases the direct current level of the output signal OUT2 according to increasing the amount of the bias current I2.

In the differential amplifier according to the second preferred embodiment of the present invention, the NMOS transistors 433 and 434 which work as the diodes are supplied with the bias current so as not to cause the gate-to-source voltage VGS of the NMOS transistors 433 and 434 to be lower a than the threshold voltage Vt. The differential amplifier according to the second preferred embodiment reduces the time required for completely finishing the discharge of the parasitic capacitance. Therefore, the differential amplifier according to the second preferred embodiment of the present invention provides an output signal that changes from a low voltage level to a high voltage level, and conversely from a high voltage level to a low voltage level, over a short time period Δt, and thus reducing distortions of the output signal.

The differential amplifier according to the second preferred embodiment of the present invention is useful for a semiconductor circuit in a device, for example, a wireless device, which uses a pulse signal having a short cycle, for example, a radio frequency wave signal.

In addition, the differential amplifier according to the second preferred embodiment of the present invention freely controls a gain according to changing a mirror ratio of the current mirror circuit.

Furthermore, the differential amplifier according to the second preferred embodiment of the present invention easily controls the direct current level of the output signal corresponding to that of the input signal according to changing the amount of the bias current I2 which is supplied by the constant current source.

A differential amplifier according to a third preferred embodiment of the present invention will be described with reference to FIG. 7.

First, the composition of the differential amplifier according to the third preferred embodiment of the present invention will be described. FIG. 7 is a block diagram showing the amplifier circuit according to the third preferred embodiment of the present invention. Like elements are given like or corresponding reference numerals in the first, second and third preferred embodiments. Thus, dual explanations of the same elements are avoided.

Figure 7:
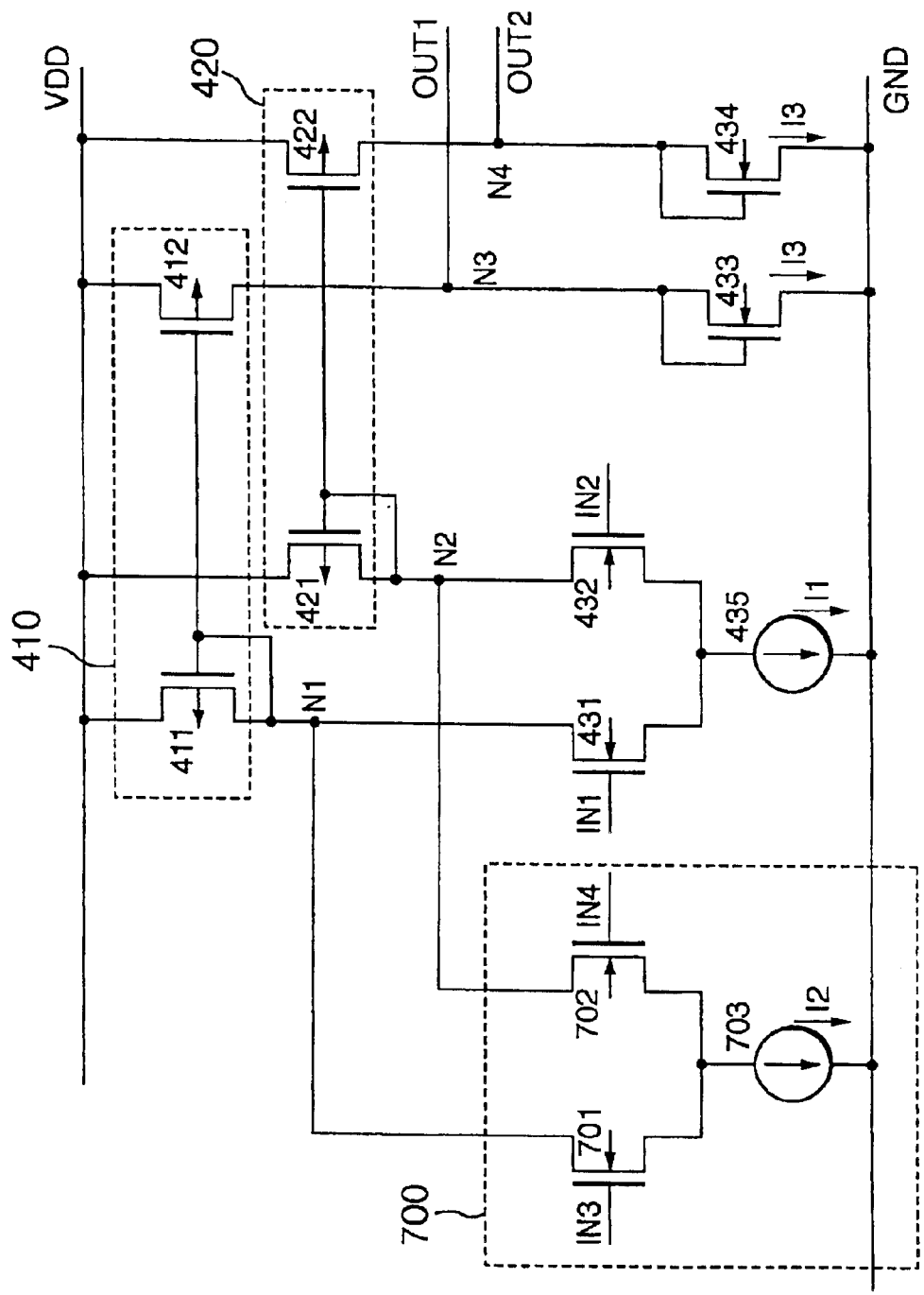
FIG. 7 is a block diagram showing a differential amplifier according to a third preferred embodiment of the present invention.

As shown in FIG. 7, the differential amplifier comprises current mirror circuits 410 and 420, transistors 431 and 432, diodes 433 and 434, a bias current supply 700 and a constant current source 435.

The bias current supply 700 comprises a transistor 701 which is coupled to the node N1 and which has a control terminal coupled to an input terminal IN3, a transistor 702 which is coupled to the node N2 and which has a control terminal coupled to an input terminal IN4 and a constant current source 703 which is coupled to the transistors 701 and 702 and which is coupled to the voltage node GND. Each of the transistors 701 and 702 comprises NMOS transistor.

The gate electrode of the NMOS transistor 701 is connected with the input terminal IN3, the drain electrode is connected with the node N1, and the source electrode is connected with one terminal of the constant current source 703. The gate electrode of the NMOS transistor 702 is connected with the input terminal IN4, the drain electrode is connected with the N2, and the source electrode is connected with the terminal of the constant current source 703. A ground voltage GND is applied to the other terminal of the constant current source 703. That is, the constant current source 703 is provided for supplying a current to the NMOS transistors 701 and 702. The direct current components being a negative feed-back input which is output by the output part are applied to the input terminals IN3 and IN4. The negative feed-back input causes the direct current offset components to cancel.

The operation of the differential amplifier according to the third preferred embodiment of the present invention is the same that of the differential amplifier according to the second preferred embodiment. Thus, dual explanations of the same operation are avoided.

In the differential amplifier according to the third preferred embodiment of the present invention, the NMOS transistors 433 and 434 which work as the diodes are supplied with the bias current so as not to cause the gate-to-source voltage VGS of the NMOS transistors 433 and 434 to be lower a than the threshold voltage Vt. The differential amplifier according to the third preferred embodiment reduces the time required for completely finishing the discharge of the parasitic capacitance. Therefore, the differential amplifier according to the third preferred embodiment of the present invention provides an output signal that changes from a low voltage level to a high voltage level, and conversely from a high voltage level to a low voltage level, over a short time period Δt, and thus reducing distortions of the output signal.

The differential amplifier according to the third preferred embodiment of the present invention is useful for a semiconductor circuit in a device, for example, a wireless device, which uses a pulse signal having a short cycle, for example, a radio frequency wave signal.

In addition, the differential amplifier according to the third preferred embodiment of the present invention freely adjusts a gain according to changing a mirror ratio of the current mirror circuit.

Furthermore, the differential amplifier according to the third preferred embodiment of the present invention easily controls the direct current level of the output signal corresponding to that of the input signal according to changing the amount of the bias current I2 which is supplied by the constant current source.

Furthermore, each bias current is generated by each of transistors 701 and 702 which operate differentially each other. The differential amplifier according to the third preferred embodiment of the present invention controls the bias current by controlling the current which is supplied to each transistor. Therefore, the differential amplifier according to the third preferred embodiment of the present invention easily controls the direct current level of the output signal.

Figure 8:
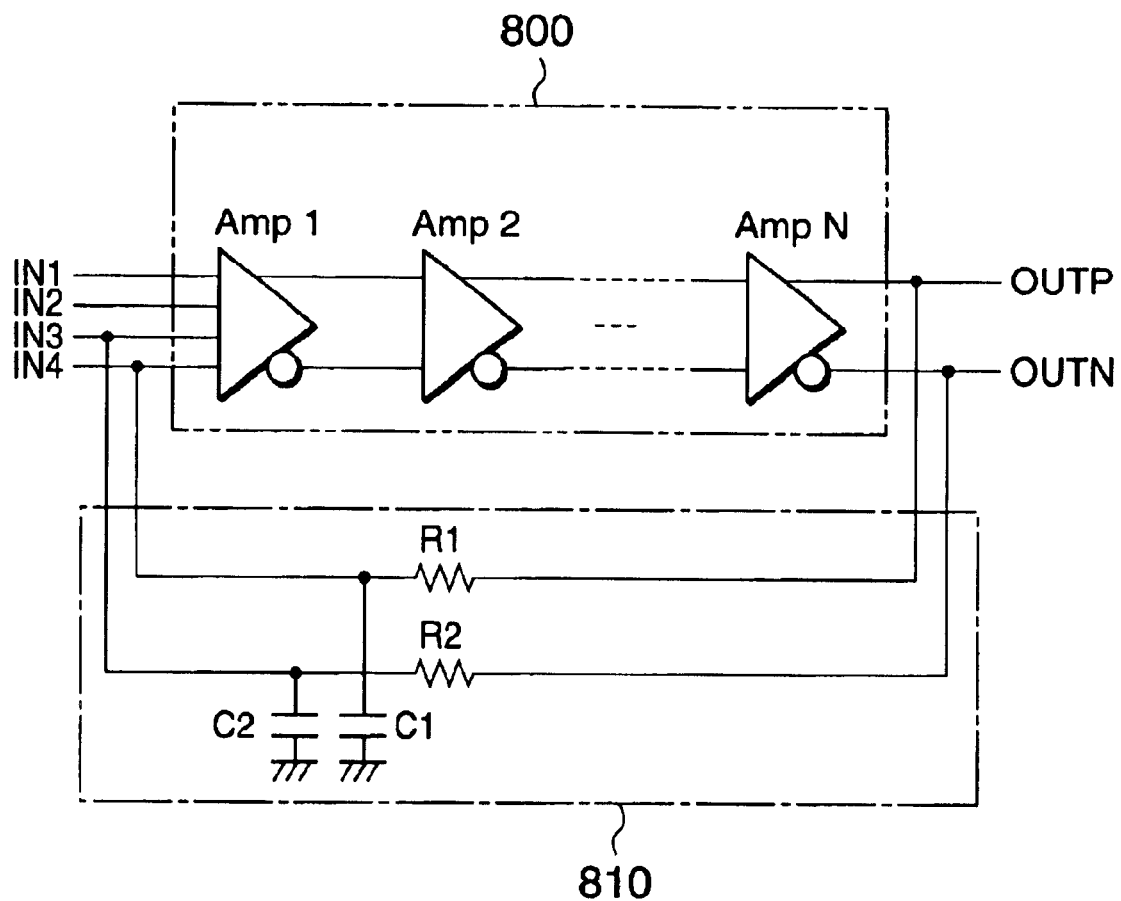
FIG. 8 is a block diagram showing a differential amplifier circuit according to a fourth preferred embodiment of the present invention.
Figure 9:
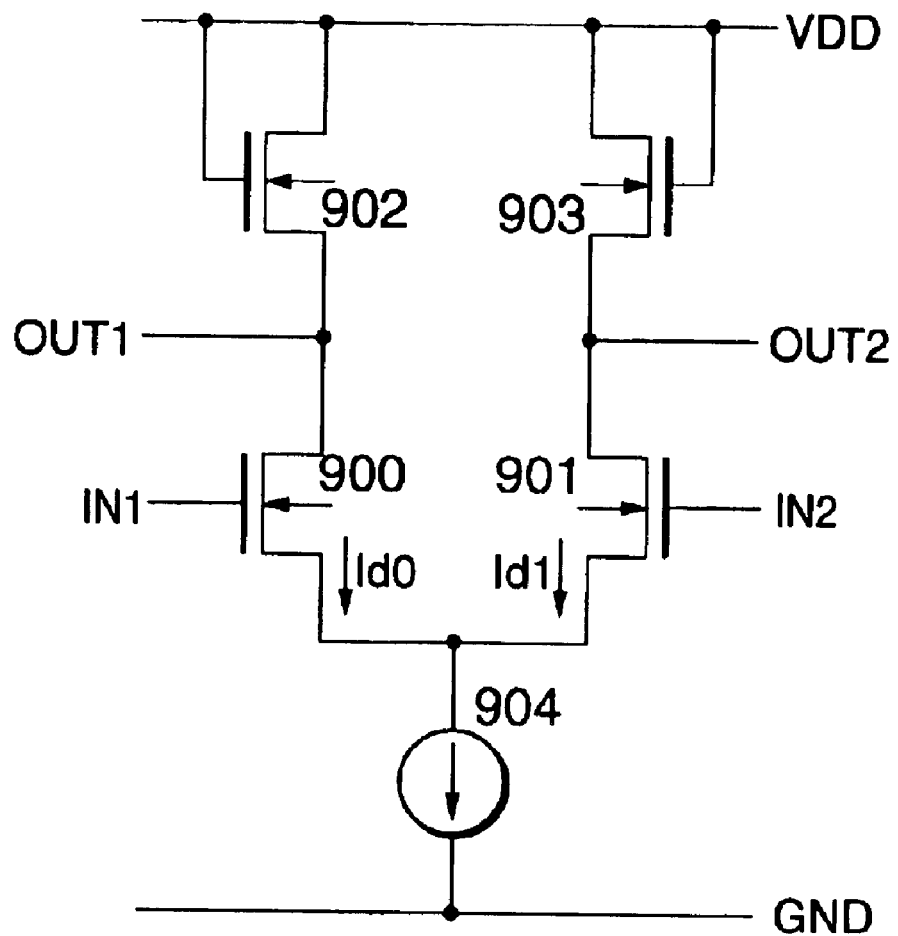
FIG. 9 is a block diagram showing a conventional differential amplifier.
Figure 10:
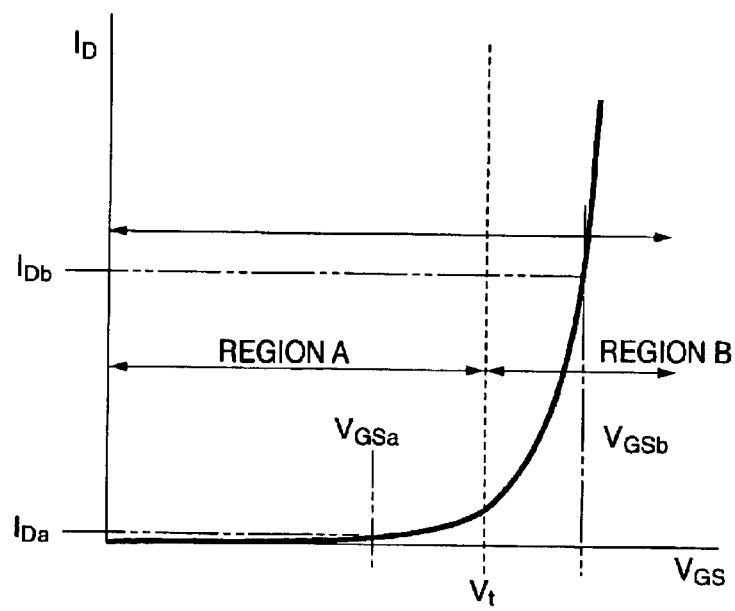
FIG. 10 is a voltage-current characteristic of the NMOS transistors of the conventional differential amplifier.
Figure 11:
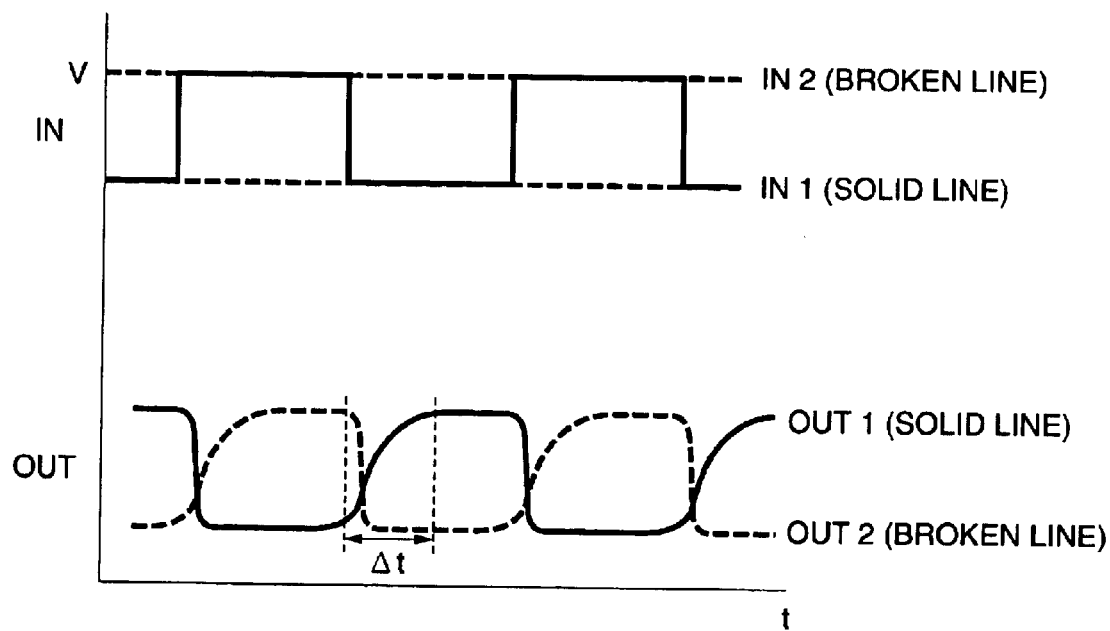
FIG. 11 is a timing chart for explaining of the operation of the conventional differential amplifier.

A differential amplifier circuit according to a fourth preferred embodiment of the present invention will be described with reference to FIG. 8. FIG. 8 is a block diagram showing a differential amplifier circuit according to the fourth preferred embodiment of the present invention. As seen in FIG. 8, the differential amplifier circuit comprises a differential amplifier part 800 and a negative feed-back part 810. The differential amplifier part 800 comprises a plurality of differential amplifiers Amp1-AmpN which are connected in series. Each of differential amplifiers has a gain, for example, αdB. The only differential amplifier Amp1 comprises the differential amplifier which is explained in the third preferred embodiment of the present invention. It is possible that each of differential amplifiers Amp2-AmpN comprises the differential amplifier which is explained in the first or second preferred embodiment of the present invention. The negative feed-back part 810 comprises resistors R1 and R2 and capacitors C1 and C2. That is, the negative feed-back part 810 is a low-pass filter which samples the direct current components of the output signal. When DC potential difference of the difference input terminals IN1 and IN2 is 0 (zero), DC potential difference of the difference output terminals OUTP and OUTN also is 0 in theory. However, in practice, DC potential difference of the difference output terminals OUTP and OUTN is not 0 for reason of production tolerance of the differential amplifier. That is, DC potential difference of the difference output terminals OUTP and OUTN has DC offset. When each gain of the differential amplifiers Amp1-AmpN is 4 dB and when the number of the differential amplifiers is 10, gain of the differential amplifier part 800 is 40 dB. When DC potential difference of the difference input terminals IN1 and IN2 is 1 mV, DC potential difference of the difference output terminals OUTP and OUTN is 100 mV. It is too large.

So, the difference output terminal OUTP connects to the input terminal IN4 shown in FIG. 7, and the difference output terminal OUTN connects to the input terminal IN3 shown in FIG. 7. The DC component (in-phase component) of the difference output terminal OUTP is higher than the DC component (negative phase component) of the difference output terminal OUTN. That is, bias current for the node N2 is more than bias current for the node N1. Otherwise, bias current for the node N1 is more than bias current for the node N2.

The difference amplifier circuit according to the fourth preferred embodiment of the present invention reduces DC offset of the difference output terminals.

While the preferred form of the present invention has been described, it is to be understood that modifications will be apparent to those skilled in the art without departing from the spirit of the invention. For example, each of transistors may comprise a bipolar transistor, a metal-semiconductor field effect transistor or a metal insulator semiconductor structure, instead of the MOSFET.

The scope of the invention, therefore, is to be determined solely by the following claims.

What is claimed is:

1. A differential amplifier, comprising:
   a first voltage node;
   a second voltage node;
   a first diode which has a first terminal and a second terminal, wherein the first terminal of the first diode is coupled to the first voltage node, and wherein the second terminal of the first diode is coupled to a first node;
   a second diode which has a first terminal and a second terminal, wherein the first terminal of the second diode is coupled to the first voltage node, and wherein the second terminal of the second diode is coupled to a second node;
   a first transistor which is coupled to the first node in series with the first diode, and which has a control terminal coupled to a first input terminal;
   a second transistor which is coupled to the second node in series with the second diode, and which has a control terminal coupled to a second input terminal;
   a constant current source which is coupled to the first and second transistors and which is coupled to the second voltage node; and
   a bias current supply which is coupled directly to the first and second nodes to bias the first and second diodes.

2. The differential amplifier according to claim 1, wherein said constant current source is a first constant current source, and wherein said bias current supply comprises a second constant current source which is coupled to said first node and which is coupled to said second voltage node, and a third constant current source which is coupled to said second node and which is coupled to said second voltage node.

3. The differential amplifier according to claim 2, wherein said first transistor has a gate electrode which is coupled to said control terminal of said first transistor, a drain electrode which is coupled to said first node and a source electrode which is coupled to said first constant current source.

4. The differential amplifier according to claim 3, wherein said second transistor has a gate electrode which is coupled to said control terminal of said second transistor, a drain electrode which is coupled to said second node and a source electrode which is coupled to said first constant current source.

5. The differential amplifier according to claim 4, wherein said first diode comprises a third transistor having gate and source electrodes which are coupled to said first terminal of said first diode and having a drain electrode which is coupled to said second terminal of said first diode.

6. The differential amplifier according to claim 5, wherein said second diode comprises a fourth transistor having gate and source electrodes which are coupled to said first terminal of said second diode and having a drain electrode which is coupled to said second terminal of said second diode.

7. The differential amplifier according to claim 6, wherein said first voltage node is supplied with a supply voltage, and wherein said second voltage node is supplied with a ground voltage.

8. A differential amplifier, comprising:

a first voltage node;

a second voltage node;

first through fourth nodes;

a first current mirror circuit having a first current path coupled between the first voltage node and the first node, and a second current path connected between the first voltage node and the third node;

a second current mirror circuit having a first current path coupled between the first voltage node and the second node, and a second current path connected between the first voltage node and the fourth node;

a first transistor which is coupled to the first node, and which has a control terminal coupled to a first input terminal;

a second transistor which is coupled to the second node, and which has a control terminal coupled to a second input terminal;

a first diode which has a first terminal and a second terminal, wherein the first terminal of the first diode is coupled to the third node, and wherein the second terminal of the first diode is coupled to the second voltage node;

a second diode which has a first terminal and a second terminal, wherein the first terminal of the second diode is coupled to the fourth node, and wherein the second terminal of the second diode is coupled to the second voltage node;

a constant current source which is coupled to the first and second transistors and which is coupled to the second voltage node; and a bias current supply which is coupled directly to the first and second nodes to bias the first and second diodes.

9. The differential amplifier according to claims 8, wherein said constant current source is a first constant current source, and wherein said bias current supply comprises a second constant current source which is coupled to said first node and which is coupled to said second voltage node, and a third constant current source which is coupled to said second node and which is coupled to said second voltage node.

10. The differential amplifier according to claim 9, wherein said first transistor has a gate electrode which is coupled to said control terminal of said first transistor, a drain electrode which is coupled to said first node and a source electrode which is coupled to said first constant current source.

11. The differential amplifier according to claim 10, wherein said second transistor has a gate electrode which is coupled to said control terminal of said second transistor, a drain electrode which is coupled to said second node and a source electrode which is coupled to said first constant current source.

12. The differential amplifier according to claim 11, wherein said first diode comprises a third transistor having gate and source electrodes which are coupled to said second terminal of said first diode and having a drain electrode which is coupled to said first terminal of said first diode.

13. The differential amplifier according to claim 12, wherein said second diode comprises a fourth transistor having gate and source electrodes which are coupled to said second terminal of said second diode and having a drain electrode which is coupled to said first terminal of said second diode.

14. The differential amplifier according to claim 13, wherein said voltage node is supplied with a around voltage.

15. The differential amplifier according to claim 8, wherein said constant current source is a first constant current source, and wherein said bias current supply comprises a third transistor which is coupled to the first node and which has a control terminal coupled to a third input terminal, a fourth transistor which is coupled to the second node and which has a control terminal coupled to a fourth input terminal, and a second constant current source which is coupled to the third and fourth transistors and which is coupled to the second voltage node.

* * * * *